United States Patent
Hyun

(10) Patent No.: US 9,524,768 B1
(45) Date of Patent: Dec. 20, 2016

(54) CONTROL CIRCUIT AND MEMORY DEVICE INCLUDING THE SAME

(71) Applicant: SK hynix Inc., Icheon-si, Gyeonggi-do (KR)

(72) Inventor: Sang Ah Hyun, Chungju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/148,564

(22) Filed: May 6, 2016

(30) Foreign Application Priority Data

Nov. 9, 2015 (KR) .......................... 10-2015-0157003

(51) Int. Cl.
G11C 7/00 (2006.01)
G11C 11/406 (2006.01)
G11C 11/408 (2006.01)
G11C 11/4076 (2006.01)

(52) U.S. Cl.
CPC ...... *G11C 11/40607* (2013.01); *G11C 11/4076* (2013.01); *G11C 11/4082* (2013.01); *G11C 11/406* (2013.01); *G11C 11/40603* (2013.01); *G11C 11/40611* (2013.01); *G11C 11/40618* (2013.01); *G11C 11/40622* (2013.01)

(58) Field of Classification Search
CPC ............. G11C 11/406; G11C 11/40607; G11C 11/40611; G11C 11/40618; G11C 11/40622; G11C 11/4076; G11C 11/4082

USPC ............................................. 365/222, 185.22
See application file for complete search history.

(56) References Cited

U.S. PATENT DOCUMENTS

| | | | |
|---|---|---|---|
| 5,798,976 A * | 8/1998 | Arimoto | G11C 11/406 365/222 |
| 5,890,198 A * | 3/1999 | Pawlowski | G11C 11/406 365/222 |
| 2002/0085443 A1 | 7/2002 | Lee | |
| 2006/0056257 A1 * | 3/2006 | Origasa | G11C 11/40618 365/222 |
| 2015/0146494 A1 | 5/2015 | Riho | |

FOREIGN PATENT DOCUMENTS

KR 1020020057054 A 7/2002

* cited by examiner

*Primary Examiner* — Tan T. Nguyen
(74) *Attorney, Agent, or Firm* — William Park & Associates Ltd.

(57) ABSTRACT

A control circuit may include a refresh time control circuit configured for controlling a refresh time on the basis of an area setting signal for setting a usage area of a memory. The control circuit may include an address control circuit configured for fixing at least one bit included in an external address on the basis of the area setting signal and an area mode signal and provide an internal address.

19 Claims, 11 Drawing Sheets

CONTROL CIRCUIT AND MEMORY DEVICE INCLUDING THE SAME

CROSS-REFERENCES TO RELATED APPLICATION

The present application claims priority under 35 U.S.C. §119(a) to Korean application number 10-2015-0157003, filed on Nov. 9, 2015, in the Korean Intellectual Property Office, which is incorporated herein by reference in its entirety.

BACKGROUND

1. Technical Field

Various embodiments generally relate to a control circuit and a memory device including the same.

2. Related Art

Defects may occur in memory cells of electronic apparatuses having increased degrees of integration. When defects occur in a part of an entire memory cell, the entire memory device may not be usable.

In order to cope with this situation, the entire memory cell may be divided into a plurality of areas and only a specific area having no defects may be used. In order to improve operational efficiency, it may be preferred to differently set operation characteristics in the case of using the entire memory cell and in the case of using only a specific area.

SUMMARY

In an embodiment, a control circuit may be provided. The control circuit may include a refresh time control circuit configured to control a refresh time on the basis of an area setting signal for setting a usage area of a memory. The control circuit may include an address control circuit configured to fix at least one bit included in an external address on the basis of the area setting signal and an area mode signal and provide an internal address.

In an embodiment, a control circuit may be provided. The control circuit may include a refresh time control circuit configured to set a refresh time on a basis of a half chip setting signal for setting use of a whole or a part of a memory including a plurality of banks. The control circuit may include a fragment control circuit configured to change a combination of banks, which may be simultaneously refreshed among the plurality of banks, on a basis of the half chip setting signal and a fragment setting signal.

In an embodiment, a memory device may be provided. The memory device may include a memory configured to be implemented with a plurality of chips having a use area set on a basis of an area setting signal. The memory device may include an operation control circuit configured to decide an input/output combination scheme on a basis of operation characteristics of the plurality of chips decided according to the setting of the use area, and to generate an address control signal based on the input/output combination scheme. The memory device may include a control circuit configured to add one fixed address bit to an external address on a basis of the address control signal, and to provide an internal address to the memory.

Wherein the operation control circuit generates the address control signal to have a parameter less than or equal to a number of parameters for an operation of each chip.

Wherein the chips have substantially a same burst length and a use area is set in a same manner on the basis of the area setting signal.

Wherein the operation control circuit generates the address control signal to have a parameter less than or equal to a number of parameters for an operation of each chip.

Wherein the operation control circuit generates an area mode signal for deciding a value of the fixed bit on a basis of a defect position of the memory, and provides the area mode signal to the control circuit.

DETAILED DESCRIPTION

In a control circuit and a memory device including the same according to various embodiments, a refresh cycle, a refresh target memory area and the like may be set on the basis of a signal for setting only a part of a memory area to be used, so that it may be possible to optimize a setting such that an appropriate operation may be performed according to use characteristics of the memory area.

A control circuit and a memory device including the same according to various embodiments, operation characteristics may be differently set according to use areas of a memory, so that it may be possible to contribute to the improvement of an operation speed of the memory device and to control a plurality of operation characteristics on the basis of one signal.

According to various embodiments, in a control circuit and a memory device including the same, it may be possible to control a refresh cycle, addresses and the like of a memory cell on the basis of an area setting signal for allowing the whole or a part of a memory to be used. Consequently, it may be possible to change entire operation characteristics on the basis of one signal according to an area to be utilized in the memory cell.

Hereinafter, a control circuit and a memory device including the same will be described below with reference to the accompanying drawings through various examples of embodiments.

Figure 1:
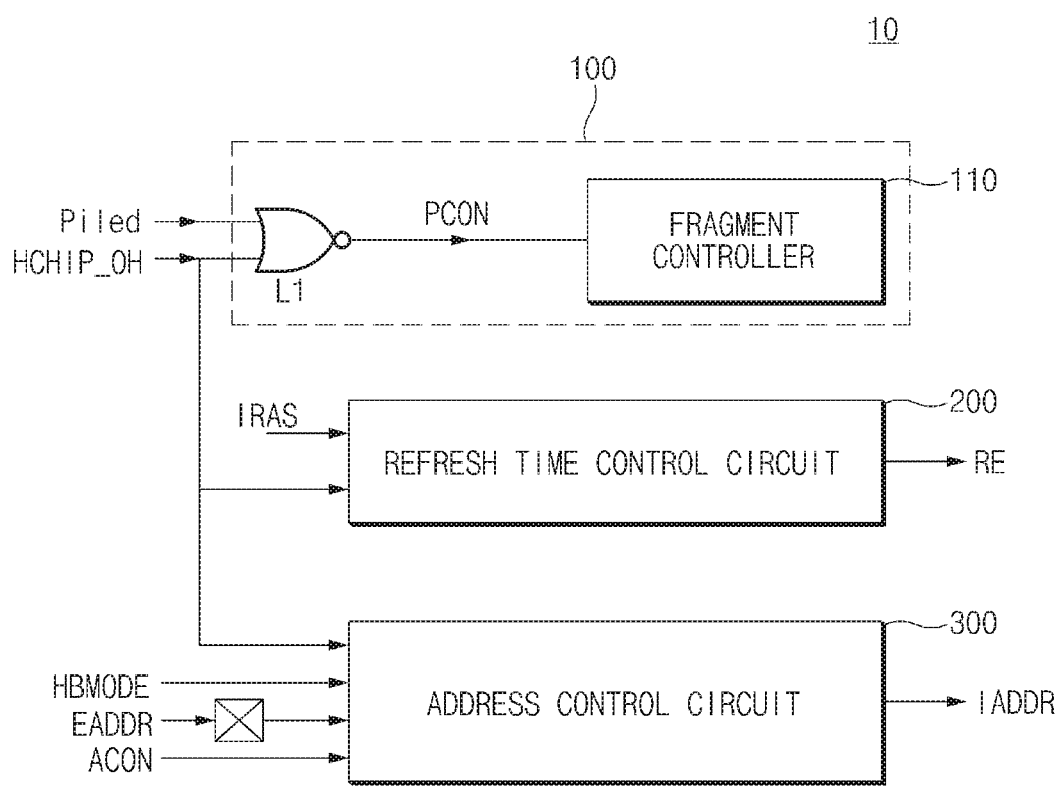
FIG. 1 is a diagram illustrating a representation of an example of a control circuit according to an embodiment.

FIG. 1 is a diagram illustrating a representation of an example of a control circuit according to an embodiment.

Referring to FIG. 1, a control circuit 10 may include a fragment control circuit 100, a refresh time control circuit 200, and an address control circuit 300. According to an embodiment, the control circuit 10 may also be implemented by selectively including only two of the aforementioned three elements.

In the case in which the control circuit 10 according to an embodiment constitutes a memory device together with a memory (not illustrated) coupled to the control circuit 10, when defects occur in a part of the memory, the control circuit 10 may set only a remaining part of the memory to be used instead of using the part of the memory in which the defects have occurred. According to an embodiment, the control circuit 10 may set only a part of the memory to be used on the basis of a signal provided from an exterior.

The control circuit 10 may be implemented with only the refresh time control circuit 200 and the address control circuit 300. The control circuit 10 may be implemented with only the fragment control circuit 100 and the refresh time control circuit 200. The control circuit 10 may be implemented with only fragment control circuit 100 and the address control circuit 300.

The control circuit 10 may set a specific area of the memory to be used, thereby allowing the entire capacity of the memory to be used or allowing only a part of the entire capacity of the memory to be used. After packaging for a memory device including the memory is completed, even though defects occur in a part of the memory, the control circuit 10 may reduce a problem whereby an entire memory is not available and allows only a remaining part with no defects to be utilized, thereby improving the yield of the memory device.

As described above, the use area of the memory is set, so that the capacity of the memory may change. Depending on the capacity of the memory, a refresh unit, a refresh cycle, an addressing method and the like, which are appropriate for the capacity, may change. The control circuit 10 according to an embodiment may set the use area of the memory, thereby appropriately controlling the refresh unit, the refresh cycle, the addressing method and the like.

The control circuit 10 may control the refresh unit, the refresh cycle, the addressing method and the like such that the memory device operates including only a memory set as the use area. For example, when an entire memory has a capacity of 2 Gb but a memory corresponding to a capacity of 1 Gb has been set as a use area, the control circuit 10 may perform a control operation to operate on the basis of substantially the same parameter as that when the memory with the capacity of 1 Gb operates when viewed from an exterior perspective.

The fragment control circuit 100 may include a first logical operator L1 and a fragment controller 110. The fragment control circuit 100 may decide the number of fragments to be divided from an entire area of the memory on the basis of an area setting signal HCHIP_ON and perform a refresh.

For example, the control circuit 10 may control the memory to be divided into four fragments and a refresh to be performed for each divided fragment while a pulse is being sequentially generated four times. However, when only a part of the memory has been set to be used on the basis of the area setting signal HCHIP_ON, the control circuit 10 may control the memory to be divided into two fragments and a refresh to be performed for each fragment while a pulse is being generated twice.

In the case of using the entire memory, although the memory has been divided into four fragments and a refresh has been performed for each fragment while a pulse is being generated four times, when a half of the memory is used on the basis of the area setting signal HCHIP_ON, it may be efficient to divide the memory into two fragments and perform a refresh only while a pulse is being generated twice.

Accordingly, the fragment control circuit 100 according to an embodiment may change a memory fragment unit, in which a refresh is simultaneously performed in the memory, on the basis of the area setting signal HCHIP_ON and a fragment setting signal Piled.

The refresh time control circuit 200 may change a delay time of a refresh setting signal IRAS on the basis of the area setting signal HCHIP_ON, thereby changing a generation time point of a reset signal RE.

The refresh cycle may correspond to a time point at which the reset signal RE is generated from a time point at which the refresh setting signal IRAS has been activated. The refresh time control circuit 200 according to an embodiment may change the time point, at which the reset signal RE is generated, on the basis of the area setting signal HCHIP_ON in response to the refresh setting signal IRAS. Accordingly, the refresh cycle may differ on the basis of the area setting signal HCHIP_ON.

Configurations and operations of the refresh time control circuit 200 will be described below with reference to FIG. 6 and FIG. 7.

The address control circuit 300 receives an external address EADDR and provides the external address EADDR as an internal address IADDR. The address control circuit 300 according to an embodiment may add a fixed address bit to the external address EADDR on the basis of the area setting signal HCHIP_ON, and provide the internal address IADDR.

When the entire memory coupled to the control circuit 10 is used, that is, when the area setting signal HCHIP_ON has been deactivated, the external address EADDR and the internal address IADDR may be substantially equal to each other.

However, when the area setting signal HCHIP_ON has been activated, only a part of the memory is set to be used, and the address control circuit 300 may add at least one bit to the external address EADDR and provide the internal address IADDR.

If the number of memory cells included in the entire memory is $2^n$ (n is a natural number), an address bit of n bits is required in order to identify the position of one memory cell of the entire memory. In the case of using a half of the memory, $2^{n-1}$ memory cells may be included in the memory being used, and an address bit of n−1 bits is required in order to identify the position of one of the memory cells.

For example, when a use area of the memory is reduced by a half, an address bit required according to the reduction is reduced one by one.

Accordingly, the memory may be actually identified as the internal address IADDR of n bits, but when the control circuit 10 has set only a half of the memory to be used, only an address bit of n−1 bits may be provided as the external address EADDR. This is because an exterior recognizes that the memory device including the control circuit 10 includes only $2^{n-1}$ memory cells and performs memory access.

Accordingly, when a half memory is set to be used on the basis of the area setting signal HCHIP_ON, the address control circuit 300 according to an embodiment employs one bit as a fixed value with respect to the external address EADDR, and provides the internal address IADDR. For example, in the case in which n address reception pins have been provided to an electronic apparatus including the control circuit 10, when the internal address IADDR is provided only to n−1 reception pins, since no signals are received through one reception pin, a voltage of the pin may be toggled. Accordingly, the control circuit 10 may generate one bit, in which the external address EADDR is not received through the address control circuit 300, as a fixed value and provide the internal address IADDR. One bit, which is not used, may be set to have a value of '1' or '0' on the basis of an area mode signal HBMODE. The internal address IADDR may be formed by adding a fixed bit to the external address EADDR.

According to an embodiment, a specific bit of the internal address IADDR generated as one fixed value may be decided according to the characteristics of the memory. In an embodiment, a fixed bit added to the external address EADDR by the address control circuit 300 may be decided according to the received external address EADDR.

According to an embodiment, the address control circuit 300 may determine a fixed bit, which is added to the external address EADDR, on the basis of an address control signal ACON. The address control signal ACON may be provided through an operation control circuit 400 (see FIG. 4).

The control circuit 10 according to an embodiment may decide memory fragments, in which a refresh operation is simultaneously performed, a refresh cycle, and a method for providing addresses on the basis of an area of the memory to be utilized.

Hereinafter, a scheme in which a control circuit according to an embodiment sets use areas of the memory and an address control method based on the scheme will be described.

Figure 2A:
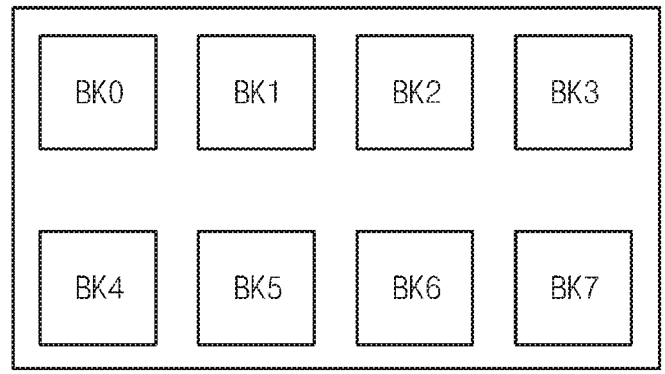
FIG. 2a to FIG. 2c and FIG. 3a to FIG. 3c are diagrams for conceptually explaining a scheme in which a control circuit according to an embodiment sets use areas of a memory.
Figure 2B:
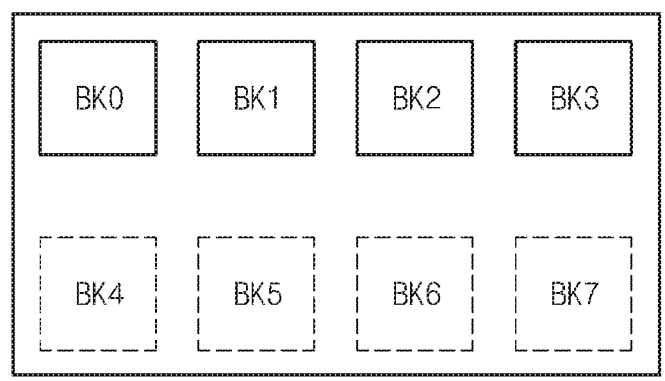
Figure 2C:
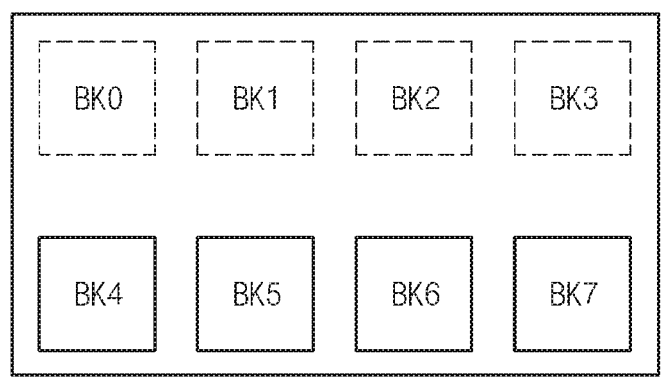

FIG. 2a to FIG. 2c are diagrams for conceptually explaining a scheme in which the control circuit according to an embodiment sets use areas of a memory.

FIG. 2a to FIG. 2c illustrate that the entire memory includes 8 banks BK0 to BK7. However, the memory may be divided into banks, pages, mats MAT and the like in various schemes, and the use areas of the memory may be set according to various division schemes without limiting to the description of the present document.

Referring to FIG. 2a to FIG. 2c, banks indicated by solid lines indicate banks used and banks indicated by dotted lines indicate banks not used. FIG. 2a illustrates the case in which all the 8 banks are used. FIG. 2b and FIG. 2c illustrate the case in which only a part of the memory is used as compared with the case of FIG. 2a.

In the case of FIG. 2a and the cases of FIG. 2b and FIG. 2c, areas of the memory to be used are respectively selected on the basis of the area setting signal HCHIP_ON and the area mode signal HBMODE, wherein it can be understood that the memory has a capacity of 1 Gb in the case of FIG. 2a and the memory has a capacity of 512 Mb corresponding to a half of 1 Gb in the case of FIG. 2b and FIG. 2c.

For example, FIG. 2a may be the case in which the area setting signal HCHIP_ON corresponds to a logical state 'low' and FIG. 2b and FIG. 2c may be the case in which the area setting signal HCHIP_ON corresponds to a logical state 'high'. That is, in the case in which the area setting signal HCHIP_ON corresponds to the logical state 'high', it can be understood that a half of the memory is set as a use area. For example, the area setting signal HCHIP_ON may correspond to a half chip setting signal.

Referring to FIG. 2b and FIG. 2c, the positions of the banks used in the memory are different from one another. Referring to FIG. 2b, the first to fourth banks BK0 to BK3 are used, and in FIG. 2c, the fifth to eighth banks BK4 to BK7 are used.

According to an embodiment, the control circuit 10 may decide the positions of the banks used in the memory on the basis of the area mode signal HBMODE. For example, the case of FIG. 2b may correspond to the case in which the area mode signal HBMODE corresponds to a logical state 'low' and the case of FIG. 2c may correspond to the case in which the area mode signal HBMODE corresponds to a logical state 'high'. The area mode signal HBMODE may be decided according to the position of a memory cell in which defects have occurred in the memory. For example, when defects have occurred in the fifth bank BK4 of the memory, the area mode signal HBMODE may be generated such that the first to fourth banks BK0 to BK3 are used as illustrated in FIG. 2b, and when defects have occurred in the third bank BK2 of the memory, the area mode signal HBMODE may be generated such that the fifth to eighth banks BK4 to BK7 are used as illustrated in FIG. 2c.

The area mode signal HBMODE may be generated in the operation control circuit 400 which will be described with reference to FIG. 4.

In order to set the use areas of the memory described with reference to FIG. 2a to FIG. 2c, the address control circuit 300 may process a bank address BA to access a specific area of the memory.

For example, the scheme for setting the use areas in FIG. 2a to FIG. 2c may be applied to a DDR2 (Double Data Rate 2) including a volatile memory cell.

In the DDR2, in order to identify 8 banks, bank addresses BA0 to BA2 of 3 bits may be required. In the case of using the entire memory as illustrated in FIG. 2a, all the bank addresses of 3 bits should be used.

As illustrated in FIG. 2b and FIG. 2c, in the case of using only four banks in the memory, the positions of the four banks may be identified only by the bank addresses BA0 and BA1 of 2 bits. Whether to use the first to fourth banks BK0 to BK3 illustrated in FIG. 2b or the fifth to eighth banks BK4 to BK7 illustrated in FIG. 2c may be decided on the basis of the area mode signal HBMODE, and thus a new internal address IADDR may be generated.

The following tables illustrate addressing of a DDR2 static ram (SRAM) stipulated in the Joint Electron Device Engineering Council (JEDEC) standard, wherein Table 1 below illustrates addressing of a 1 Gb memory and Table 2 below illustrates addressing of a 512 Mb memory.

TABLE 1

| Configuration | 256 Mb × 4 | 128 Mb × 8 | 64 Mb × 16 |
| --- | --- | --- | --- |
| # of Banks | 8 | 8 | 8 |
| Bank Address | BA0-BA2 | BA0-BA2 | BA0-BA2 |
| Auto precharge | A10/AP | A10/AP | A10/AP |
| Row Address | A0-A13 | A0-A13 | A0-A12 |
| Column Address | A0-A9, A11 | A0-A9 | A0-A9 |
| Page size | 1 KB | 1 KB | 2 KB |

TABLE 2

| Configuration | 128 Mb × 4 | 64 Mb × 8 | 32 Mb × 16 |
| --- | --- | --- | --- |
| # of Banks | 4 | 4 | 4 |
| Bank Address | BA0, BA1 | BA0, BA1 | BA0, BA1 |
| Auto precharge | A10/AP | A10/AP | A10/AP |
| Row Address | A0-A13 | A0-A13 | A0-A12 |
| Column Address | A0-A9, A11 | A0-A9 | A0-A9 |
| Page size | 1 KB | 1 KB | 2 KB |

Referring to Table 1 and Table 2 above, when the 1 Gb memory is reduced to the 512 Mb memory, changed values are bank address values and the number of banks used according to the bank address values.

For example, in the 1 Gb memory, 8 banks should be identified, but in the 512 Mb memory, only four banks are identified.

As described with reference to FIG. 2a to FIG. 2c, when only a half of the memory have been set to be used, for example, when the area setting signal HCHIP_ON corresponds to the logical state 'high', the bank addresses BA0 and BA1 of 2 bits are used.

Accordingly, the bank addresses BA0 and BA1 of 2 bits are received in the control circuit 10 as the external address EADDR. However, since the memory included in the control circuit 10 is provided with pins through which all the bank addresses of 3 bits are received, a pin for receiving the third bank address BA2 may be toggled. The address control circuit 300 may generate the internal address IADDR by adding the bank address BA2 of one bit having a fixed value to the received bank addresses BA0 and BA1 of 2 bits.

Banks to used in the entire bank may be decided on the basis of the area mode signal HBMODE as described with reference to FIG. 2a to FIG. 2c.

For example, when the bank addresses BA0 and BA1 of 2 bits are received, only a bank to be accessed among four banks may be decided. However, actually, since 8 banks are provided, the positions of banks to be accessed on the basis of the external address EADDR may differ according to whether to set use areas with respect to four of the first to fourth banks BK0 to BK3 or whether to set use areas with respect to four of the fifth to eighth banks BK4 to BK7.

When the first to fourth banks BK0 to BK3 have been set as the use areas as illustrated in FIG. 2b, the area mode signal HBMODE may correspond to the logical state 'low', and when the fifth to eighth banks BK4 to BK7 have been set as the use areas, the area mode signal HBMODE may correspond to the logical state 'high'.

The address control circuit 300 included in the control circuit 10 may decide the value of an address bit, which is added to the external address EADDR and has a fixed value, on the basis of the area mode signal HBMODE.

Figure 3A:
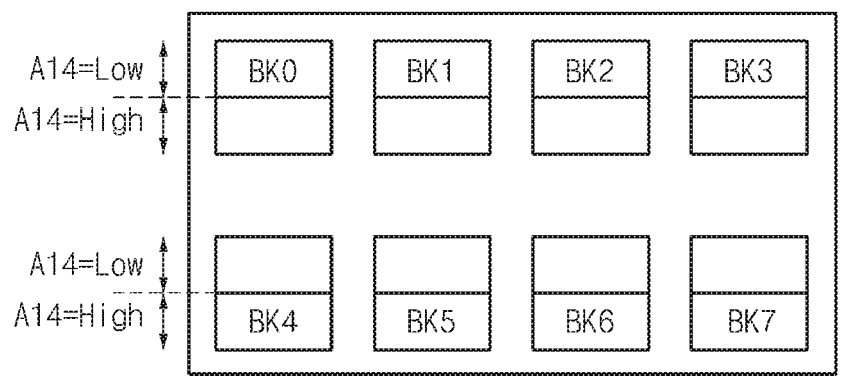
Figure 3B:
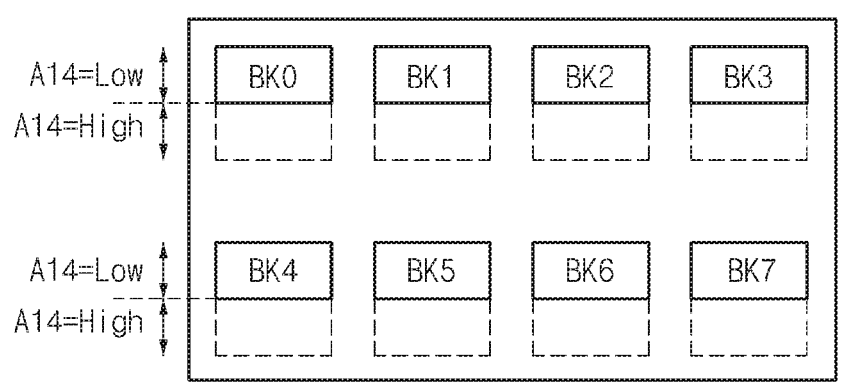
Figure 3C:
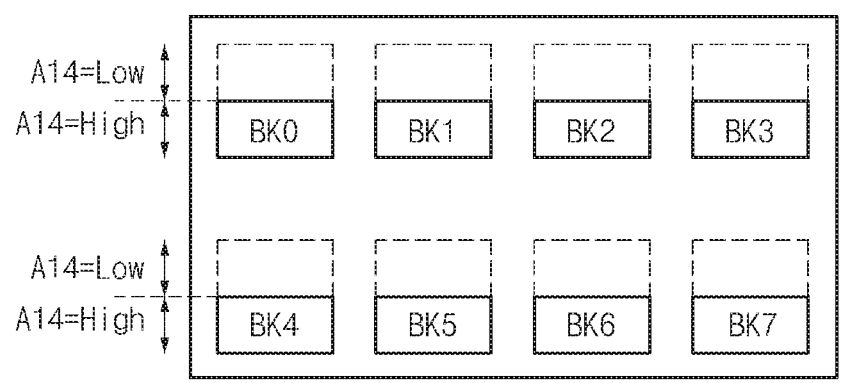

FIG. 3a to FIG. 3c are diagrams for conceptually explaining a scheme in which the control circuit according to an embodiment sets use areas of a memory. For example, FIG. 3a to FIG. 3c may correspond to a scheme of setting the use areas of the memory in a DDR3.

Referring to FIG. 3a to FIG. 3c, a half of an entire memory is set to be selectively used similarly to FIG. 2a to FIG. 2c, but the use or non-use of a specific bank is not set by processing the bank address BA as illustrated in FIG. 2a to FIG. 2c. That is, each of 8 banks is divided into two by processing a row address RA and use areas are selected from the banks divided into two.

For example, the memory illustrated in FIG. 3a to FIG. 3c may have a density of 2 Gb. Referring to FIG. 3a, all the 8 banks BK0 to BK7 are used. The control circuit 10 may access a memory designated in the memory on the basis of the bank addresses BA0 to BA2 of 3 bits and row addresses A0 to A14 of 15 bits.

Referring to FIG. 3b and FIG. 3c, all the 8 banks are used, but in the case of FIG. 3b, only half banks, in which the fifth row address bit A14 of the row addresses corresponds to a logical state 'low', are used, and in the case of FIG. 3c, only half banks, in which the fifth row address bit A14 corresponds to a logical state 'high, are used. Accordingly, in FIG. 3b and FIG. 3c, the use areas of the memory may have a density of 1 Gb.

Referring to FIG. 3a, the position of a memory cell to be accessed in the memory may be identified by utilizing all the row addresses A0 to A14 of 15 bits. However, when defects have occurred in a specific position of the memory, the position with the defects is not used.

As the area setting signal HCHIP_ON is activated, an exterior of the control circuit 10 recognizes that only a half of the memory is used, so that values, except for one bit of the row addresses A0 to A14 for identifying the position of the memory in FIG. 3a, may be provided as the external address EADDR.

Since an area identifiable through a row address (for example, A14) of one bit is limited, only a half of the memory is used. Since the row addresses A0 to A13 of 14 bits may be provided from an exterior and there may be an input pin also assigned to an unused row address of one bit, it is necessary to generate the internal address IADDR such that the unused address has one fixed value to substantially prevent a signal from being toggled through the input pin.

The control circuit 10 may utilize only a half of the memory by utilizing only the row addresses A0 to A13 of 14 bits as illustrated in FIG. 3b and FIG. 3c. The address control circuit 300 included in the control circuit 10 allows the last fifth row address bit A14 to have one fixed value in order to identify the position of the memory.

The following tables illustrate addressing of a DDR3 SRAM stipulated in the JEDEC standard, wherein Table 3 below illustrates addressing of a 2 Gb memory and Table 4 below illustrates addressing of a 1 Gb memory.

TABLE 3

| Configuration | 256 Mb × 4 | 128 Mb × 4 | 64 Mb × 16 |
| --- | --- | --- | --- |
| # of Banks | 8 | 8 | 8 |
| Bank Address | BA0-BA2 | BA0-BA2 | BA0-BA2 |
| Auto precharge | A10/AP | A10/AP | A10/AP |
| BC switch on the fly | A12/BC# | A12/BC# | A12/BC# |
| Row Address | A0-A14 | A0-A14 | A0-A13 |
| Column Address | A0-A9, A11 | A0-A9 | A0-A9 |
| Page size | 1 KB | 1 KB | 2 KB |

Table 3 above illustrates the case in which the entire memory is used as described in FIG. 3a, and it can be understood that all the bank addresses BA0 to BA2 of 3 bits are used and the row addresses A0 to A14 of 15 bits are used. However, since the configuration of 64 Mb×16 has a page size of 2 KB, the row addresses A0 to A13 of 14 bits reduced by one bit may be used.

When defects have occurred in a part of the 2 Gb memory, only a half of the memory is allowed to be used according to the defect positions, so that a half of the memory is selectively used as illustrated in FIG. 3b and FIG. 3c. When viewed from an exterior, it may be substantially equal to the case of using a 1 Gb memory.

TABLE 4

| Configuration | 256 Mb × 4 | 128 Mb × 4 | 64 Mb × 16 |
| --- | --- | --- | --- |
| # of Banks | 8 | 8 | 8 |
| Bank Address | BA0-BA2 | BA0-BA2 | BA0-BA2 |
| Auto precharge | A10/AP | A10/AP | A10/AP |
| BC switch on the fly | A12/BC# | A12/BC# | A12/BC# |
| Row Address | A0-A13 | A0-A13 | A0-A12 |
| Column Address | A0-A9, A11 | A0-A9 | A0-A9 |
| Page size | 1 KB | 1 KB | 2 KB |

Referring to Table 4, even in the case of using the 1 Gb memory, the bank addresses BA0 to BA2 of 3 bits are used similarly to the case of using the 2 Gb memory. However, it can be understood that row addresses are reduced by one bit according to its configuration as compared with the case of using the 2 Gb memory. For example, in the configuration of 256 Mb×4 or 128 Mb×4, the row addresses A0 to A14 of 15 bits are used in the case of the 2 Gb memory but the row addresses A0 to A13 of 14 bits are used in the case of the 1 Gb memory. In the configuration of 64 Mb×16, the row addresses A0 to A13 of 14 bits are used in the case of the 2 Gb memory but the row addresses A0 to A12 of 13 bits are used in the case of the 1 Gb memory.

Accordingly, when a half of the memory has been set to be used on the basis of the area setting signal HCHIP_ON as described with reference to FIG. 3b and FIG. 3c, the control circuit 10 may control the last address bit of the row address to be fixed to one value.

For example, the address control circuit 300 may decide the value of the last address bit (for example, A14) of the row address on the basis of the area mode signal HBMODE, and provide the internal address IADDR.

However, as described with reference to FIG. 2a to FIG. 2c, the address control circuit 300 generates the last bank address of the bank addresses to a fixed value on the basis of the area mode signal HBMODE, and as described with reference to FIG. 3a to FIG. 3c, the address control circuit 300 generates the last row address of the row addresses to a fixed value on the basis of the area mode signal HBMODE.

As described above, the control circuit 10 including the address control circuit 300 may generate the internal address IADDR according to an operation scheme of a memory device including the control circuit 10, the type of the memory device, or a preset scheme such as a DDR2 or a DDR3 of the memory device.

Alternatively, on the basis of the received external address EADDR, the address control circuit 300 may detect information not received from the external address, and employ a corresponding bit as a fixed value, thereby generating the internal address IADDR. In an embodiment, on the basis of the address control signal ACON, the address control circuit 300 may generate a bit value of a specific address as a fixed value, thereby generating the internal address IADDR.

Figure 4:
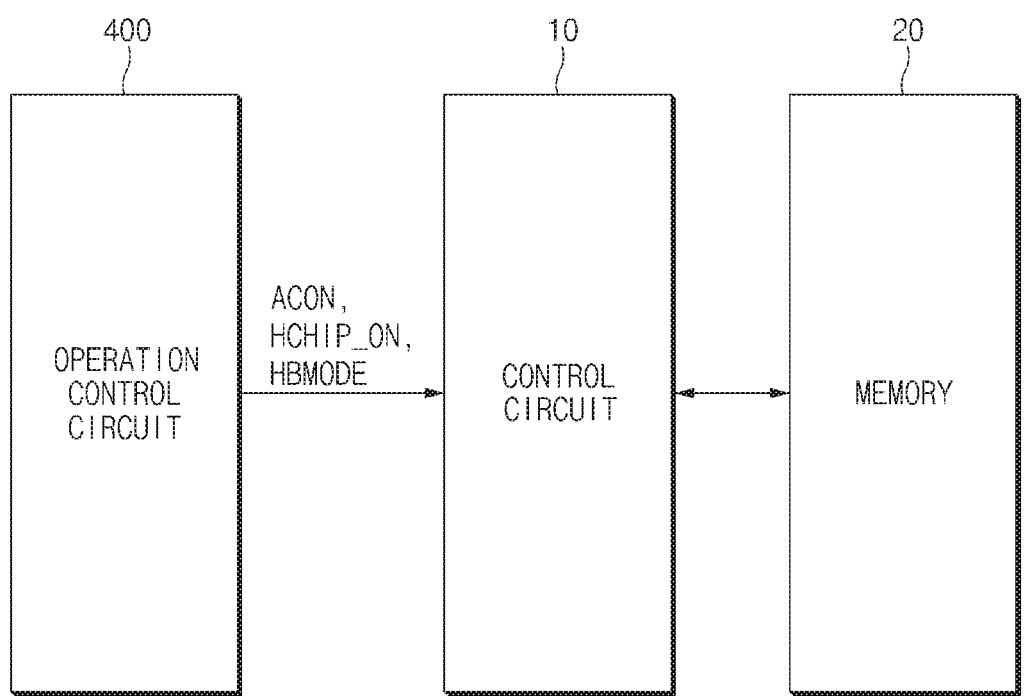
FIG. 4 and FIG. 5 are block diagrams illustrating a representation of an example of a memory device including a control circuit according to embodiments.

FIG. 4 is a block diagram illustrating a representation of an example of a memory device including a control circuit according to an embodiment.

Referring to FIG. 4, a memory device 1 may include the operation control circuit 400, a control circuit 10, and a memory 20.

The operation control circuit 400 may provide the control circuit 10 with the area setting signal HCHIP_ON, the area mode signal HBMODE, and the address control signal ACON. As described above, the operation control circuit 400 may generate the signals on the basis of whether defects have been occurred in the memory 20 and defect occurrence positions and provide the control circuit 10 with the signals.

According to an embodiment, on the basis of a test mode signal TM, the operation control circuit 400 may generate the area setting signal HCHIP_ON and the area mode signal HBMODE. In an embodiment, the operation control circuit 400 may include a fuse and the fuse is cut according to a signal provided from an exterior, thereby providing the control circuit 10 with the test mode signal TM and the area setting signal HCHIP_ON.

The operation control circuit 400 may generate the address control signal ACON according to defect occurrence positions or an entire driving scheme of the memory device 1, thereby determining whether to generate the internal address IADDR by generating a bit value of the external address EADDR as a fixed bit.

The control circuit 10 may have substantially the same configuration as that described with reference to FIG. 1 and may perform substantially the same operation. The control circuit 10 may receive the area setting signal HCHIP_ON, the area mode signal HBMODE, and the address control signal ACON from the operation control circuit 400 and change a refresh unit and a refresh cycle. The control circuit 10 may receive the fragment setting signal Piled, the refresh setting signal IRAS and the external address EADDR, and may output the reset signal RE, the internal address IADDR, referring to FIG. 1. Furthermore, the control circuit 10 may change an addressing scheme and enables access to the memory 20.

The memory 20 may include a volatile memory cell such as a SRAM (Static RAM), a DRAM (Dynamic RAM), and a SDRAM (Synchronous DRAM), and a nonvolatile memory cell such as a ROM (Read Only Memory), a PROM (Programmable ROM), an EEPROM (Electrically Erasable and Programmable ROM), an EPROM (Electrically Programmable ROM), a flash memory, a PRAM (Phase change RAM), a MRAM (Magnetic RAM), a RRAM (Resistive RAM), and a FRAM (Ferroelectric RAM).

When the memory 20 includes a plurality of chips instead of one chip, it is necessary to change an address control scheme due to the characteristics of each chip when use areas are set through the control circuit 10.

Figure 5:
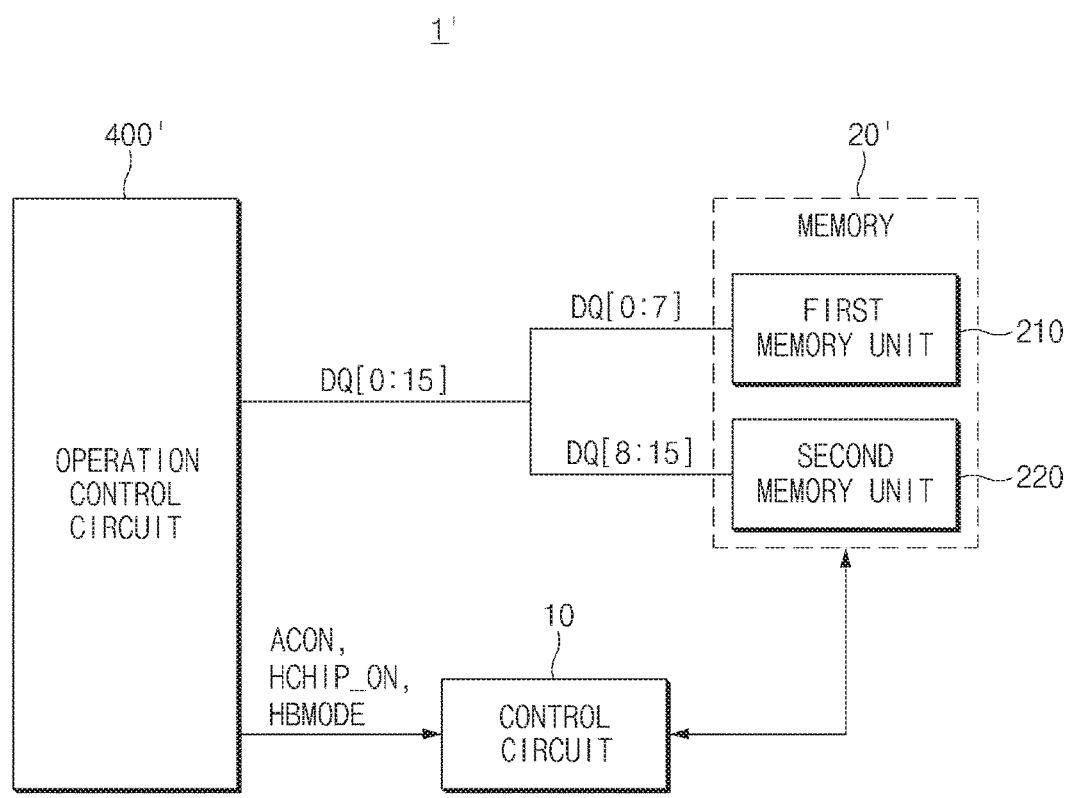

With reference to FIG. 5, operation characteristics of an address control circuit when use areas of a memory have been set as described above and an input/output configuration of an electronic apparatus based on the operation characteristics will be described.

Referring to FIG. 5, a memory device 1' may include an operation control circuit 400' including the control circuit 10, and a memory 20'.

The operation control circuit 400' is an integrated control device for controlling an entire operation of the memory device 1' and may correspond to a chipset. The memory 20' may include first and second memory units 210 and 220. The first and second memory units 210 and 220 may correspond to various combinations of memory cell units including a plurality of memory cells.

In the present document, the case in which the first and second memory units 210 and 220 correspond to chip units, their capacities are 1 Gb, and operate as a DDR2 by addressing conforming to the standard illustrated in Table 1 above will be described as an example but the embodiments are not limited to this example. The first memory unit 210 performs a 8-bit input/output operation of DQ[0:7] and the second memory unit 220 performs a 8-bit input/output operation of DQ[8:15], wherein they perform simultaneous input/output of 16-bit data with respect to the operation control circuit 400'.

In general, the operation control circuit 400' performs a x16 operation with respect to the memory 20' of 2 Gb which is the total capacities of the first and second memory units 210 and 220. That is, in an embodiment, when the area setting signal HCHIP_ON is deactivated for the control circuit 10 and the entire memory 20' is used, the operation control circuit 400' may mutually operate with the memory 20' through the x16 of 2 Gb.

The following Table 5 illustrates addressing of a 2 Gb DDR2 SRAM in the JEDEC standard.

TABLE 5

| Configuration | 512 Mb × 4 | 256 Mb × 4 | 128 Mb × 16 |
|---|---|---|---|
| # of Banks | 8 | 8 | 8 |
| Bank Address | BA0-BA2 | BA0-BA2 | BA0-BA2 |
| Auto precharge | A10/AP | A10/AP | A10/AP |

TABLE 5-continued

| Configuration | 512 Mb × 4 | 256 Mb × 4 | 128 Mb × 16 |
|---|---|---|---|
| Row Address | A0-A14 | A0-A14 | A0-A13 |
| Column Address | A0-A9, A11 | A0-A9 | A0-A9 |
| Page size | 1 KB | 1 KB | 2 KB |

The operation control circuit 400' performs addressing with the standard of 128 Mb×16 and the first and second memory units 210 and 220 perform addressing with the standard of 128 Mb×8 of Table 1 above. These have substantially the same addressing standard. Accordingly, the control circuit 10 does not need to separately differ addressing and provide data to the memory 20'.

However, when the area setting signal HCHIP_ON has been activated and only a half of the first and second memory units 210 and 220 has been set to be used, the first memory unit 210 and the second memory unit 220 perform an addressing operation of 528 Mb×8.

Referring to the addressing standard of the 68 Mb×8 operation in Table 2 above, it can be understood that the bank addresses BA0 and BA1 of 2 bits are used and the row addresses A0 to A13 of 14 bits are used.

When the first and second memory units 210 and 220 perform the addressing operation as described above, the operation control circuit 400' recognizes that the memory 20' performs a x16 operation of 1 Gb and operates on the basis of the recognition. In the case in which the memory 20' performs the x16 operation of 1 Gb, when the addressing standard is confirmed in Table 1 above (68 Mb×16), the bank addresses BA0 to BA2 of 3 bits are used and the row addresses A0 to A12 of 13 bits are used.

Accordingly, address matching may not be possible between the bank addresses and the row addresses used in the memory 20' and the operation of the memory 20' recognized by the operation control circuit 400'. This is because the bank addresses of 3 bits are used and the row addresses of 13 bits are provided by the operation control circuit 400' but the bank addresses of 2 bits and the row addresses of 14 bits are used in the memory 20' differently from the case in which a specific bit of a specific external address EADDR is not sufficient and the internal address IADDR is provided as a fixed value as described with reference to FIG. 2a to FIG. 2c and FIG. 3a to FIG. 3c.

If the operation control circuit 400' provides the bank addresses of 3 bits but the memory 20' may recognize only the bank addresses of 2 bits, the memory 20' may not normally operate according to addresses provided by the operation control circuit 400'. The addressing of the operation control circuit 400' may not exceed addressing recognizable by the memory 20'.

Accordingly, the operation control circuit 400' may operate with a SDP (Single Die Package) of 512 Mb, which performs addressing smaller than or equal to that of the memory 20', while performing the x16 operation.

The following Table 6 illustrates addressing of the DDR2 SRAM of the SDP in the JEDEC standard.

TABLE 6

| Configuration | 1 Gb (64 Mb × 16) | 1 Gb (128 Mb × 8) | 512 Mb (64 Mb × 8) | 512 Mb (32 Mb × 16) |
|---|---|---|---|---|
| # of Banks | 8 | 8 | 4 | 4 |
| Bank Address | BA0-BA2 | BA0-BA2 | BA0, BA1 | BA0, BA1 |
| Auto precharge | A10/AP | A10/AP | A10/AP | A10/AP |
| Row Address | A0-A12 | A0-A13 | A0-A13 | A0-A12 |
| Column Address | A0-A9, A11 | A0-A9 | A0-A9 | A0-A9 |
| Page size | 2 KB | 1 KB | 1 KB | 2 KB |

The operation control circuit 400' generates the address control signal ACON and provides the address control signal ACON to the control circuit 10, thereby performing the x16 operation as the SDP of 512 Mb. The operation control circuit 400' transmits/receives data to/from the memory 20' by using the bank addresses BA0 and BA1 of 2 bits and the row addresses A0 to A12 of 13 bits.

Since the memory 20' uses the bank addresses of 2 bits and the row addresses of 14 bits, the last bit of the row addresses should be generated as one fixed value with respect to the row addresses of 13 bits used by the operation control circuit 400' and should be used as the internal address IADDR. FIG. 5 illustrates that the operation control circuit 400' includes the control circuit 10 and the description has been give based on the configuration; however, the control circuit 10 may be formed at a position physically separated from the operation control circuit 400' or may also be positioned in the memory 20'.

The 14$^{th}$ row address bit A13 included in the control circuit 10 may correspond to address information for selecting the left or the right of a half bank. Accordingly, when the 14$^{th}$ row address bit A13 is fixed as one value and is provided as the internal address IADDR, a half of banks set to be used in the first and second memory units 210 and 220 may be used.

As described above, the control circuit 10 may decide an addressing method according to the operation characteristics of the memory 20' and the address control signal 300 may operate based on the addressing method. This may be based on characteristics in which the first and second memory units 210 and 220 operate with a specific burst length.

Figure 6:
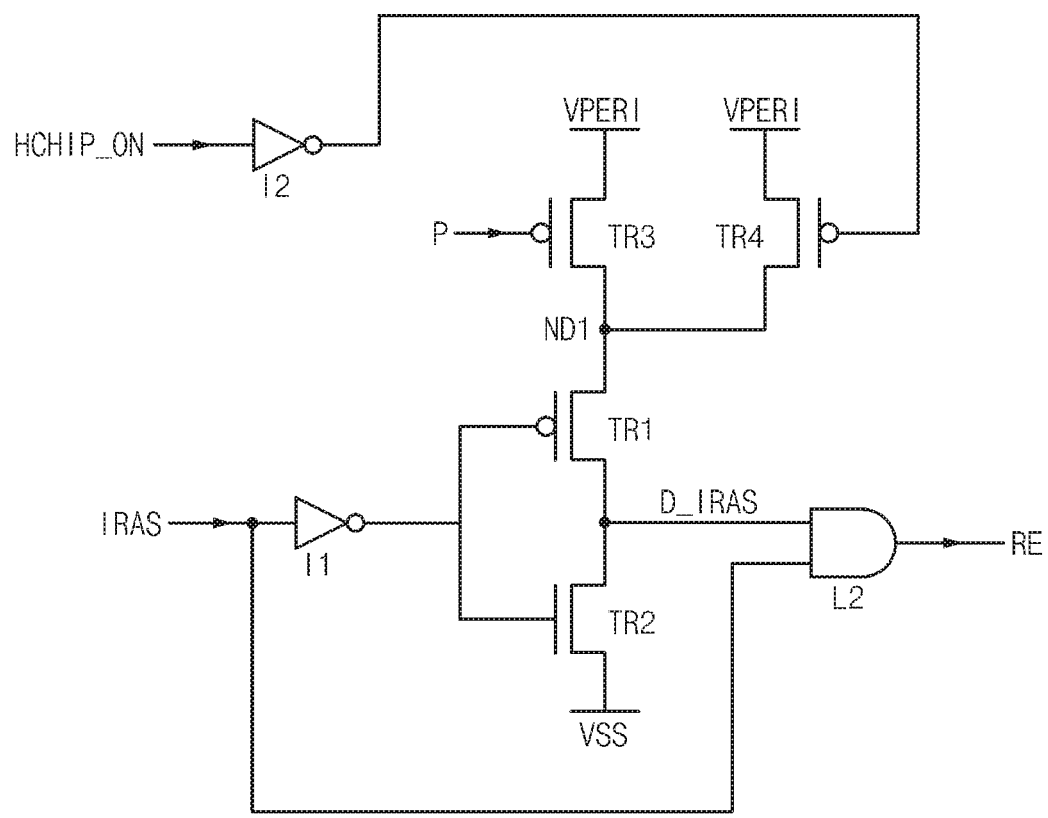
FIG. 6 is a circuit diagram illustrating a representation of an example of a refresh time control circuit according to an embodiment.

FIG. 6 is a circuit diagram illustrating a representation of an example of the refresh time control circuit according to an embodiment.

Referring to FIG. 6, the refresh time control circuit 200 changes a delay time of a refresh setting signal IRAS on the basis of the area setting signal HCHIP_ON, provides a delayed refresh setting signal D_IRAS, and performs a logic operation, for example, an OR operation on the delayed refresh setting signal D_IRAS and the refresh setting signal IRAS, thereby generating a reset signal RE.

For example, the refresh time control circuit 200 may include first to fourth transistors TR1 to TR4 and logical operators I1, I2, and L2.

For example, the first inverter I1, which may be one of the logical operators, inverts the refresh setting signal IRAS and provides the inverted signal to gate terminals of the first and second transistors TR1 and TR2. The first and second transistors TR1 and TR2 are serially coupled to each other between a first node ND1 for receiving a driving voltage VPER1 and a ground voltage VSS, and output the delayed refresh setting signal D_IRAS. Since the driving abilities of the first and second transistors TR1 and TR2 differ according to the size of a voltage provided to the first node ND1, the delay time of the delayed refresh setting signal D_IRAS may differ.

The third transistor TR3 may provide the driving voltage VPER1 to the first node ND1 in response to a power signal P. According to an embodiment, since power is turned on and simultaneously the power signal P may be transitioned to a logical state 'low', the driving voltage VPER1 may be always provided to the first node ND1 when the power has been applied.

The fourth transistor TR4 may additionally provide the driving voltage VPER1 to the first node ND1 in response to a signal obtained by inverting the area setting signal HCHIP_ON by the second inverter I2 which may be one of the logical operators.

That is, as described with reference to FIG. 2b and FIG. 2c and FIG. 3b and FIG. 3c, when the area setting signal HCHIP_ON has been provided such that only a half of the memory is used, the driving voltage VPER1 may be additionally provided to the first node ND1, so that the delay time of the delayed refresh setting signal D_IRAS is further shortened.

The second operator L2, which is one of the logical operators, performs an OR operation on the delayed refresh setting signal D_IRAS and the refresh setting signal IRAS, thereby generating the reset signal RE.

In an embodiment, a delay circuit may include complementary transistors including the first transistor TR1 and the second transistor TR2 configured as illustrated in FIG. 6. The delay circuit may include a setting transistor including transistor TR4 configured as illustrated in FIG. 6.

Figure 7:
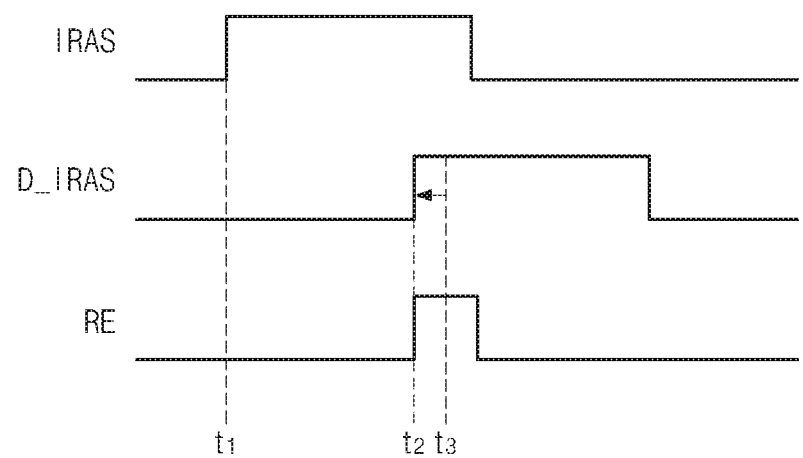
FIG. 7 is a waveform diagram for explaining an operation of a refresh time control circuit described with reference to FIG. 6.

FIG. 7 is a waveform diagram for explaining the operation of the refresh time control circuit described with reference to FIG. 6.

Referring to FIG. 7, when the refresh setting signal IRAS is transitioned from a logical state 'low' to a logical state 'high' at a time point $t_1$, a predetermined time passes from the time point $t_1$ and then the delayed refresh setting signal D_IRAS is provided. When the area setting signal HCHIP_ON corresponds to a logical state 'low', that is, when the entire memory has been set to be used, the delayed refresh setting signal D_IRAS may be transitioned at a time point $t_3$.

As the fourth transistor TR4 is turned on in response to the area setting signal HCHIP_ON, the driving voltage VPER1 is additionally provided to the first node ND1 and driving ability is improved, so that the delayed refresh setting signal D_IRAS is transitioned at a time point $t_2$.

Accordingly, a time point at which the reset signal RE is generated is also advanced to the time point $t_2$ from the time point $t_3$. The refresh cycle may correspond to the time point at which the reset signal RE has been generated from the time point at which the refresh setting signal IRAS has been transitioned. That is, when the area setting signal HCHIP_ON corresponds to a logical state 'low', the refresh cycle is from the time point $t_1$ to the time point $t_3$, but when the area setting signal HCHIP_ON corresponds to a logical state 'high', the refresh cycle may be from the time point $t_1$ to the time point $t_2$. In other words, the end point of the refresh cycle may be reduced to the time point $t_2$ from the time point $t_3$ according to the area setting signal HCHIP_ON.

Figure 8:
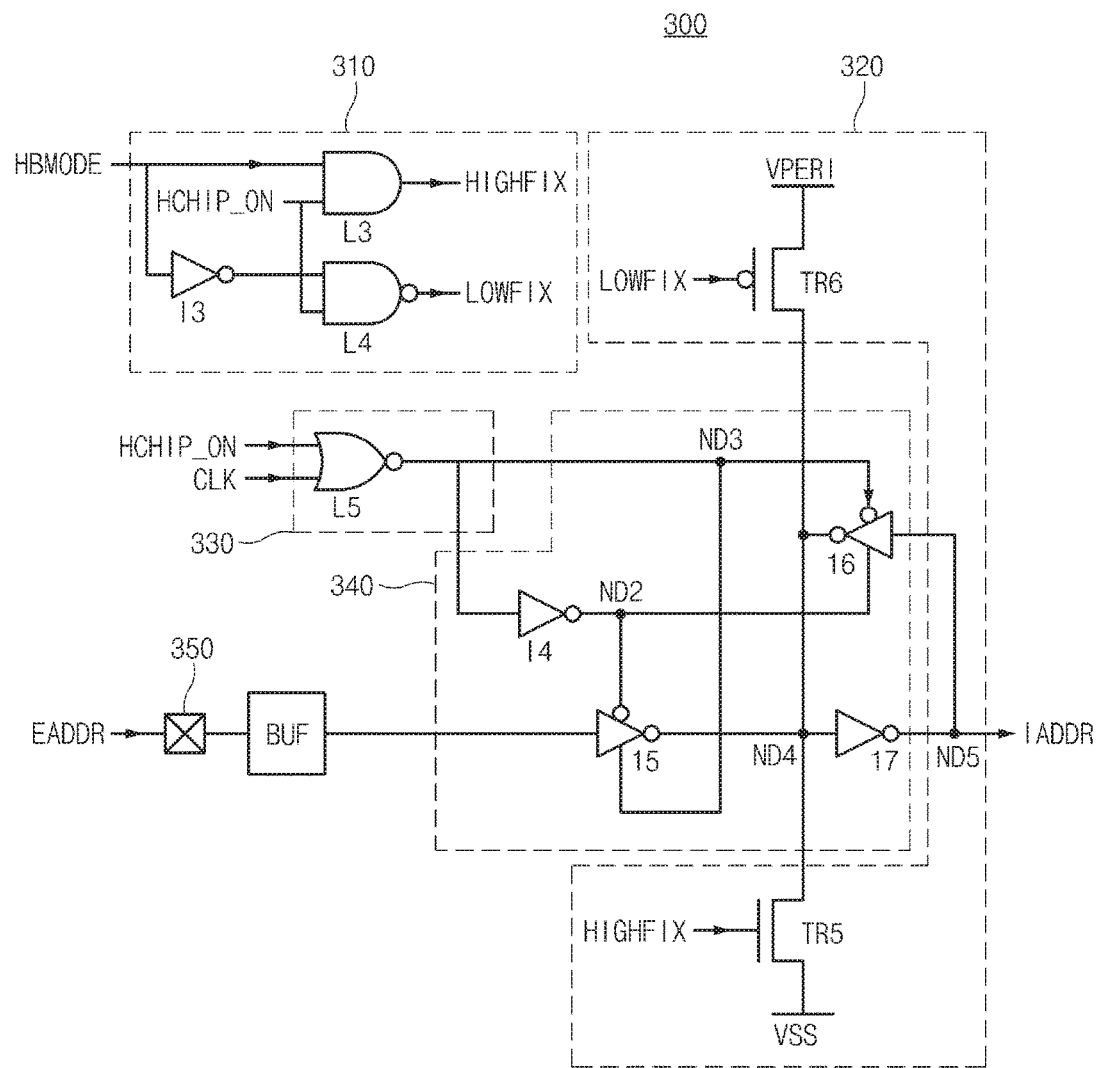
FIG. 8 is a circuit diagram illustrating a representation of an example of an address control circuit according to an embodiment.

FIG. 8 is a circuit diagram illustrating a representation of an example of the address control circuit according to an embodiment.

FIG. 8 illustrates an example of a circuit configured for generating an internal address of one bit of a circuit that generates an internal address including a plurality of bits. As described above, an address bit of internal address bits, which is to be generated as a fixed value in order to generate the internal address IADDR, may be decided on the basis of the address control signal ACON.

Referring to FIG. 8, the address control circuit 300 may include an address fixing circuit 310, a fixed voltage provision circuit 320, a latch operation control circuit 330, and a latch 340.

The address control circuit 300 decides a fixed value of at least one bit of the external address EADDR on the basis of the area mode signal HBMODE, and provides the internal address IADDR.

The address fixing circuit 310 generates address fixing signals HIGHFIX and LOWFIX on the basis of the area setting signal HCHIP_ON and the area mode signal HBMODE. The address fixing circuit 310 may include a third inverter I3 and third and fourth operators L3 and L4.

The third operator L3 performs an AND operation on the area mode signal HBMODE and the area setting signal HCHIP_ON, thereby providing the first address fixing signal HIGHFIX. The fourth operator L4 performs an AND operation on a signal obtained by inverting the area mode signal HBMODE through the third inverter I3 and the area setting signal HCHIP_ON, thereby generating the second address fixing signal LOWFIX.

The address fixing signals HIGHFIX and LOWFIX are provided to the fixed voltage provision circuit 320, thereby allowing a voltage to be provided to the latch 340, wherein the voltage corresponds to a fixed value corresponding to a specific logical state.

According to an embodiment, the area setting signal HCHIP_ON provided to the address fixing circuit 310 may be deactivated on the basis of the address control signal ACON. FIG. 8 illustrates a circuit that generates one address bit of a plurality of address bits and the description has been give based on the configuration; however, as described above, in an embodiment, a specific bit may be generated as a fixed value and provided as the internal address IADDR. Information of the internal address IADDR having the fixed value may be decided on the basis of the address control signal ACON, and in a bit in which a value substantially equal to the external address EADDR is provided to the internal address IADDR on the basis of the address control signal ACON, the address control circuit 300 illustrated in FIG. 8 may not operate. Accordingly, although the area setting signal HCHIP_ON has been activated, the area setting signal HCHIP_ON may be deactivated for a specific address bit according to the address control signal ACON and the external address EADDR may be provided as the internal address IADDR as is.

The fixed voltage provision circuit 320 may include a fifth transistor TR5 that provides the ground voltage VSS to the latch 340 (exactly, a fourth node ND4) in response to the first address fixing signal HIGHFIX, and a sixth transistor TR6 that provides the driving voltage VPER1 to the latch 340 (exactly, the fourth node ND4) in response to the second address fixing signal LOWFIX.

A signal provided to a third node ND3 and inverted internal clock signals provided to a second node ND2 after being inverted through a fourth inverter I4 are respectively provided to a sixth inverter I6 and a fifth inverter I5, so that the latch 340 may provide the external address EADDR as the internal address IADDR in synchronization with the internal clock signals.

In relation to the external address EADDR, a fixed voltage value may be provided to the fourth node ND4 between the sixth inverter I6 and a seventh inverter I7, in which an output terminal of the sixth inverter I6 is coupled to an input terminal of the seventh inverter I7 and an output terminal of the seventh inverter I7 is coupled to an input terminal of the sixth inverter I6, on the basis of the address fixing signals HIGHFIX and LOWFIX. Accordingly, the internal address IADDR may have a fixed value based on the address fixing signals HIGHFIX and LOWFIX regardless of the external address EADDR.

According to an embodiment, the address control circuit 300 may further include a latch operation control circuit 330 that logically operates the area setting signal HCHIP_ON and an external clock signal CLK and provides an internal clock signal. The latch operation control circuit 330 may include a fifth operator L5 that performs a NOR operation. The latch operation control circuit 330 may invert the external clock signal CLK and provide the inverted signal as the internal clock signal, or provide the internal clock signal having one fixed value according to the area setting signal HCHIP_ON regardless of the external clock signal CLK.

Accordingly, in the case of using an entire memory on the basis of the area setting signal HCHIP_ON, the address control circuit 300 according to an embodiment may provide the external address EADDR as the internal address IADDR as is in synchronization with the external clock signal CLK, but when the area setting signal HCHIP_ON is set such that a half of the memory is used, the address control circuit 300 decides at least one bit of bits constituting an address as a fixed value and provides the fixed value as the internal address.

The fixed value provided as the internal address IADDR may differ according to the area mode signal HBMODE as described with reference to FIG. 2b and FIG. 2c and FIG. 3b and FIG. 3c.

Figure 9:
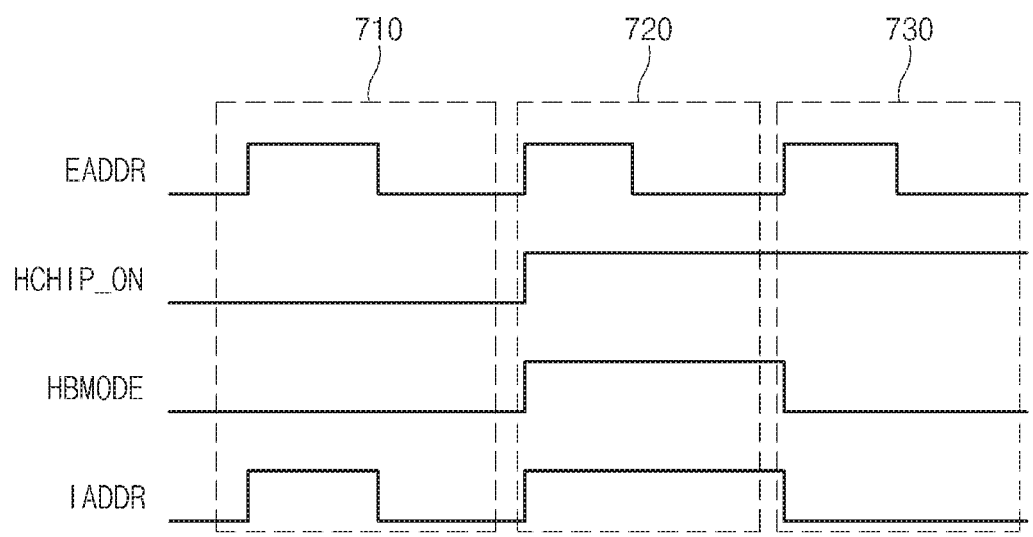
FIG. 9 is a waveform diagram for explaining an operation of an address control circuit according to an embodiment.

FIG. 9 is a waveform diagram for explaining the operation of the address control circuit according to an embodiment.

Referring to FIG. 9, in a first period 710, the area setting signal HCHIP_ON corresponds to a logical state 'low' and an entire memory may be used.

In the first period, the first address fixing signal HIGHFIX of the address fixing circuit 310 corresponds to a logical state 'low', so that the fifth transistor TR5 of the fixed voltage provision circuit 320 is turned off, and the second address fixing signal LOWFIX corresponds to a logical state 'high', so that the sixth transistor TR6 of the fixed voltage provision circuit 320 is turned off. Accordingly, the driving voltage VPER1 or the ground voltage VSS is not provided to the fourth node ND4.

Furthermore, also in the latch operation control circuit 330, the external clock signal CLK may also be provided to the second node ND2 and the third node ND3 as the internal clock signal as is. Accordingly, the external address EADDR provided through a pad 350, buffer BUF is provided as the internal address IADDR as is.

In a second period 720, the area setting signal HCHIP_ON has been transitioned to a logical state 'high' and the area mode signal HBMODE corresponds to a logical state 'high'. As the area setting signal HCHIP_ON is transitioned to the logical state 'high', output corresponding to a logical state 'low' is provided by the latch operation control circuit 330 regardless of the external clock signal CLK.

Furthermore, the address fixing circuit 310 provides the first address fixing signal HIGHFIX and the second address fixing signal LOWFIX corresponding to a logical state 'high' on the basis of the area setting signal HCHIP_ON and the area mode signal HBMODE.

The fifth transistor TR5 is turned on the basis of the first address fixing signal HIGHFIX to provide the fourth node ND4 with the ground voltage VSS, and the sixth transistor TR6 is turned off the basis of the second address fixing signal LOWFIX.

Accordingly, regardless of the external address EADDR, a value of a fifth node ND5, which is obtained by inverting the ground voltage VSS provided to the fourth node ND4, is outputted as the internal address IADDR.

In a third period 730, since the area setting signal HCHIP_ON corresponds to a logical state 'high', output corresponding to a logical state 'low' is provided by the latch operation control circuit 330 regardless of the external clock signal CLK, similarly to the second period 720.

Differently from the second period 720, in the third period 730, since the area mode signal HBMODE corresponds to a logical state 'low', the address fixing circuit 310 provides the first address fixing signal HIGHFIX the second address fixing signal LOWFIX corresponding to a logical state 'low' on the basis of the area setting signal HCHIP_ON and the area mode signal HBMODE.

The fifth transistor TR5 is turned off the basis of the first address fixing signal HIGHFIX and the sixth transistor TR6 is turned on the basis of the second address fixing signal LOWFIX. Accordingly, a value corresponding to the driving voltage VPER1 provided through the sixth transistor TR6 is provided to the fourth node ND4 of the latch 340, so that a voltage value corresponding to a logical state 'high' is provided as the internal address IADDR through the fifth node ND5.

The control circuit and the memory device including the same according to an embodiment set the whole or a part of a memory to be used on the basis of the area setting signal, and control operation characteristics to be suitable for such setting. For example, the control circuit and the memory device including the same according to an embodiment may adjust at least one characteristic of a refresh unit fragment, a refresh cycle, and an addressing method on the basis of the setting of use areas of the memory.

The control circuit and the memory device including the same according to an embodiment may perform addressing in different schemes according to the operation characteristics of the memory device.

While various embodiments have been described above, it will be understood to those skilled in the art that the embodiments described are by way of example only. Accordingly, the control circuit and the memory device including the same described herein should not be limited based on the described embodiments.

What is claimed is:

1. A control circuit comprising:
    a refresh time control circuit configured to control a refresh time on a basis of an area setting signal, which is used for setting a usage area of a memory; and
    an address control circuit configured to add a fixed address bit to an external address on a basis of the area setting signal and an area mode signal and provide an internal address.

2. The control circuit of claim 1, wherein the area setting signal corresponds to a half chip setting signal.

3. The control circuit of claim 2, wherein the refresh time control circuit comprises:
    a delay circuit configured to change a delay time of a refresh setting signal on the basis of the area setting signal and provide a delayed refresh setting signal; and
    an operator configured to generate a reset signal on a basis of the delayed refresh setting signal and the refresh setting signal.

4. The control circuit of claim 3, wherein the delay circuit comprises:
   complementary transistors configured to be serially coupled between a driving voltage and a ground voltage and be driven in response to the refresh setting signal; and
   a setting transistor configured to be coupled to a node to which the driving voltage is provided, to additionally provide the driving voltage in response to the area setting signal to further shorten a delay time of the delayed refresh setting signal.

5. The control circuit of claim 4, further comprising:
   a transistor configured to provide the driving voltage to the node based on a power signal.

6. The control circuit of claim 2, wherein the address control circuit decides a value of the fixed address bit on the basis of the area mode signal and provides the internal address.

7. The control circuit of claim 6, wherein the area mode signal includes a half chip mode signal.

8. The control circuit of claim 6, wherein the address control circuit comprises:
   an address fixing circuit configured to generate an address fixing signal on the basis of the area setting signal and the area mode signal;
   a fixed voltage provision circuit configured to provide a latch with a voltage corresponding to the fixed value on a basis of the address fixing signal; and
   a latch configured to provide the external address as the internal address in synchronization with an internal clock signal.

9. The control circuit of claim 8, further comprising:
   a latch operation control circuit configured to perform a logical operation on the area setting signal and an external clock signal and provide the internal clock signal.

10. The control circuit of claim 8, further comprising:
    a latch operation control circuit configured to receive the area setting signal and an external clock signal and provide the internal clock signal having a fixed value according to the area setting signal regardless of the external clock signal.

11. The control circuit of claim 2, further comprising:
    a fragment control circuit configured to change a memory fragment unit, in which refresh is simultaneously performed in the memory, on a basis of the area setting signal and a fragment setting signal.

12. The control circuit of claim 2, further comprising:
    a fragment control circuit configured to determine a number of fragments to be divided from an entire area of the memory based on the area setting signal and perform a refresh.

13. A control circuit comprising:
    a refresh time control circuit configured to set a refresh time on a basis of a half chip setting signal for setting use of a whole or a part of a memory including a plurality of banks; and
    a fragment control circuit configured to change a combination of banks, which are simultaneously refreshed among the plurality of banks, on a basis of the half chip setting signal and a fragment setting signal.

14. The control circuit of claim 13, further comprising:
    an address control circuit configured to add at least one fixed address bit to an external address on a basis of the half chip setting signal and a half chip mode signal, and provide an internal address.

15. The control circuit of claim 14, wherein the fixed address bit includes at least one of a bank address and a row address.

16. The control circuit of claim 14, wherein when the memory operates in a DDR3 scheme, the address control circuit adds at least one bit of the row address and generates the internal address.

17. The control circuit of claim 13, further comprising:
    an address control circuit configured to add at least one fixed address bit to an external address based on a received external address.

18. A memory device comprising:
    a memory configured to be implemented with a plurality of chips having a use area set on a basis of an area setting signal;
    an operation control circuit configured to decide an input/output combination scheme on a basis of operation characteristics of the plurality of chips decided according to the setting of the use area, and to generate an address control signal based on the input/output combination scheme; and
    a control circuit configured to add one fixed address bit to an external address on a basis of the address control signal, and to provide an internal address to the memory, wherein the control circuit controls a refresh time and a size of the memory utilized, which is simultaneously refreshed, on the basis of the area setting signal.

19. The memory device of claim 18, wherein the operation characteristics include at least one of a burst length, a bank address, and a row address of the chips.

* * * * *